United States Patent [19]
McShane

[11] Patent Number: 5,294,827
[45] Date of Patent: Mar. 15, 1994

[54] SEMICONDUCTOR DEVICE HAVING THIN PACKAGE BODY AND METHOD FOR MAKING THE SAME

[75] Inventor: Michael B. McShane, Austin, Tex.
[73] Assignee: Motorola, Inc., Schaumburg, Ill.
[21] Appl. No.: 991,548
[22] Filed: Dec. 14, 1992
[51] Int. Cl.⁵ .................. H01L 23/48; H01L 29/44; H01L 29/52; H01L 29/60
[52] U.S. Cl. .................. 257/666; 257/667; 257/668; 257/676
[58] Field of Search ............ 257/666, 667, 668, 669, 257/670, 671, 672, 673, 674, 675, 676

[56] References Cited

U.S. PATENT DOCUMENTS

| | | | |
|---|---|---|---|
| 4,661,837 | 4/1987 | Sono | 257/666 |
| 4,721,994 | 1/1988 | Mine et al. | 257/671 |
| 4,811,081 | 3/1989 | Lyden | 257/672 |
| 4,812,421 | 3/1989 | Jung et al. | 257/668 |
| 5,072,280 | 12/1991 | Matsukura | 257/670 |
| 5,101,324 | 3/1992 | Sato | 257/787 |
| 5,130,783 | 7/1992 | McLellan | 257/676 |
| 5,138,438 | 8/1992 | Masayuki et al. | 357/75 |
| 5,214,845 | 6/1993 | King et al. | 257/668 |

Primary Examiner—Sheilva V. Clark
Attorney, Agent, or Firm—Minh-Hien N. Clark

[57] ABSTRACT

A thin semiconductor device (50) can be cost effectively manufactured using conventional wire bonding technology and stamped leadframes. A flagless leadframe (12) is utilized in one embodiment. A support tape (14) having a die support surface (20) is attached transversely to a plurality of leads (18) of the leadframe. A semiconductor die (16) is attached on its active surface to the die support surface such that the active surface is coplanar with the leadframe. Low loop wire bonds (24) electrically connect the die to the leadframe. A resin encapsulant package body (52) is molded around the active surface of the die, the wire bonds, and a portion of the leads. An inactive surface of the die is exposed for enhanced thermal dissipation in addition to enabling a thin package body. External lead configuration of the semiconductor device is not limited.

14 Claims, 3 Drawing Sheets

1

SEMICONDUCTOR DEVICE HAVING THIN PACKAGE BODY AND METHOD FOR MAKING THE SAME

CROSS-REFERENCE TO RELATED APPLICATION

Related subject matter is disclosed in U.S. Patent application by Bennett A. Joiner, Jr. entitled "Drop In Heat Sink Package with Window Frame Flag," Ser. No. 07/871,776 filed on Apr. 21, 1992 and assigned to the assignee hereof.

FIELD OF THE INVENTION

The field of the invention relates to semiconductor devices generally, and more specifically to a resin encapsulated semiconductor device having a thin package body.

BACKGROUND OF THE INVENTION

Semiconductor devices are widely used in various types of electronic products, consumer products, portable equipment, integrated circuit cards, and the like. One feature of semiconductor devices which is important in many of these applications is the thickness of a semiconductor device. It is desirable to keep the profile of the device as thin as possible in certain applications and/or products where a slim and lightweight design is preferable.

In addition to establishing a thin profile semiconductor device, manufacturers are also driven to maintain a low manufacturing cost. A significant material cost in manufacturing a semiconductor device other than the semiconductor die is the leadframe. The cost of a leadframe can be reduced significantly if the production level is high enough such that the leadframe can be stamped instead of etched.

Tape automated bonding (TAB) can be used to manufacture thin profile semiconductor devices. However, TAB is complex assembly process as compared to traditional plastic assembly of semiconductor devices using conventional processing equipment and methods. Furthermore, TAB tape, which is composed of patterned metal on polymer tape such as copper on polyimide, is costly because the metal pattern has to be etched. Additionally, in order to electrically connect a semiconductor die to the metallized TAB tape, either the die or the tape has to be gold bumped which is more costly and more complex than conventional wire bonding. A need exists for an easily manufacturable thin profile semiconductor device which is cost effective.

SUMMARY OF THE INVENTION

In accordance with the invention, there is provided a semiconductor device having a thin package body and a method for producing the same. A leadframe having a surface and a plurality of leads having a length and a surface, is provided. An electrically nonconductive support tape having a die support surface is attached to a portion of the surface of the leadframe. A semiconductor die having an active surface and an inactive surface is attached by its active surface to the die support surface of the electrically nonconductive support tape, so that the active surface is substantially coplanar with the surface of the plurality of leads. The semiconductor die is wire bonded to the plurality of leads for electrical connections. A resin package body is molded around the active surface of the semiconductor die, the electrical connections and a portion of the length of the plurality of leads, wherein that portion of the length is completely encapsulated by the resin package body. The invention provides a structure produced by the above method.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
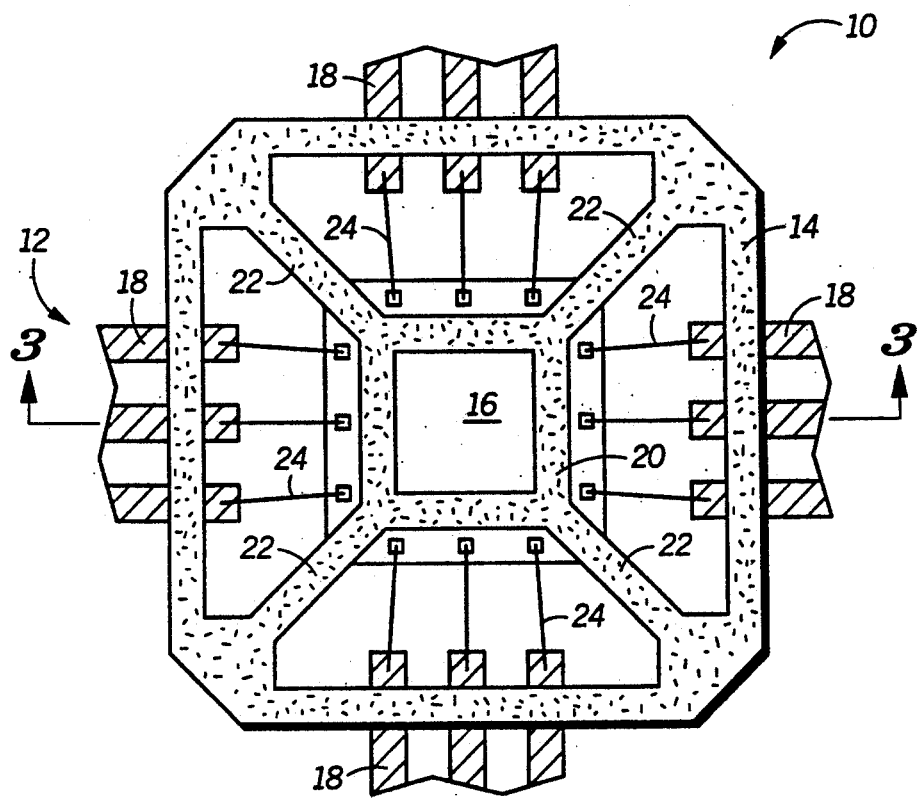
FIG. 1 illustrates, in a top view, a semiconductor die attached to a leadframe (partially illustrated) via one configuration of a support tape, in accordance with the present invention.

The invention will now be discussed with reference to the figures. In FIG. 1, a top view of a leadframe assembly 10 is partially illustrated. Leadframe assembly 10 is composed of a leadframe 12 (partially illustrated), a support tape 14, and a semiconductor die 16. Leadframe 12 has a top surface and a plurality of leads 18. As illustrated in FIG. 1, the plurality of leads 18 surround all four sides of the semiconductor die 16, which is typical of a thin quad flat pack (TQFP) configuration wherein leads extend from all four sides of a semiconductor device. Microprocessors typically require leads on all four sides because the devices are designed with bonding pads around the perimeter of the semiconductor dice. Each of the plurality of leads 18 has a length and a top surface. The support tape 14 is attached to a portion of the leadframe 12 on its top surface. The support tape 14 is an electrically nonconductive material, preferably a polymer tape, with a polyimide layer and an adhesive layer, wherein the adhesive layer is used to attach the support tape to the leadframe. One such example of a polymer tape that can be used to practice the invention is Upilex 25S.

The electrically nonconductive support tape 14 has a die support surface 20. In this illustration, die support surface 20 has a window frame configuration wherein the center region of the die support surface 20 has been removed so that the remaining surface forms a frame. However, it is not necessary for the die support surface 20 to have a window frame configuration to practice the invention. Other configurations may also be used. For example, a full surface similar to a leadframe flag may be used. The support tape 14 is attached transversely to the length of the leads 18 in this illustration. By having the support tape 14 attached across the leads 18, the leads 18 are stabilized which is important in fine-pitch applications. Some fine-pitched leadframes already have a tape across the leads for stabilization. The support tape 14 can replace the existing leadframe tape and may be applied to the leadframe by the leadframe manufacturer. In this manner, no extra processing step is required to attach the support tape 14 to the leadframe 12 because the support tape 14 can be attached in place of existing leadframe tape. Furthermore, redesign of the leadframe is not necessary, because existing lead pitch geometry can still be used.

The electrically nonconductive support tape 14 also has tie bars 22 that support the die support surface 20. In this illustration, the leadframe 12 does not have any tie bars typically found in a leadframe because leadframe 12 does not have a leadframe flag for mounting the semiconductor die 16. If the leadframe had tie bars present, then the support tape 14 would be attached to the leadframe tie bars as well as the leads for support. Other embodiments having leadframe tie bars will be discussed in greater detail later. The tensile strength of Upilex 25S, a material which can be used for the support tape 14, is 40 kilogram per millimeter$^2$. The standard thickness for this material is 0.05 millimeter. With a tie bar of 0.5 millimeter and 1 millimeter width, the strength of the support tape tie bar is 1 kilogram and 2 kilograms, respectively. A die support surface having 4 of these tie bars is sufficiently strong to support a semiconductor die. The width of the support tape tie bars may vary depending on the size of the semiconductor die to be supported.

Also illustrated in FIG. 1 is a semiconductor die 16 having an active surface and an inactive surface, wherein the active surface is shown in this top view. The active surface of the semiconductor die 16 is attached to the die support surface 20 of the support tape 14 so that the active surface is substantially coplanar with the top surface of the plurality of leads 18 of the leadframe 12. This feature will become more apparent in a cross-sectional view along line 3—3. Semiconductor die 16 is electrically connected to the leadframe 12 by a plurality of wire bonds 24 extending from the active surface of the semiconductor die 16 to the top surface of the plurality of leads 18. A major advantage of using conventional wire bonding to electrically connect the die 16 to the leadframe 12 over using TAB is cost. TAB requires etched metal patterns on the copper polymer tape and gold bumping on either the semiconductor die or the tape, which is much more expensive than conventional stamped metal leadframes and conventional wire bonding. Moreover, TAB is a more complex process that requires tighter control in order to achieve successful bonding, whereas wire bonding is a lower cost and simpler process that has been well characterized.

Figure 2:
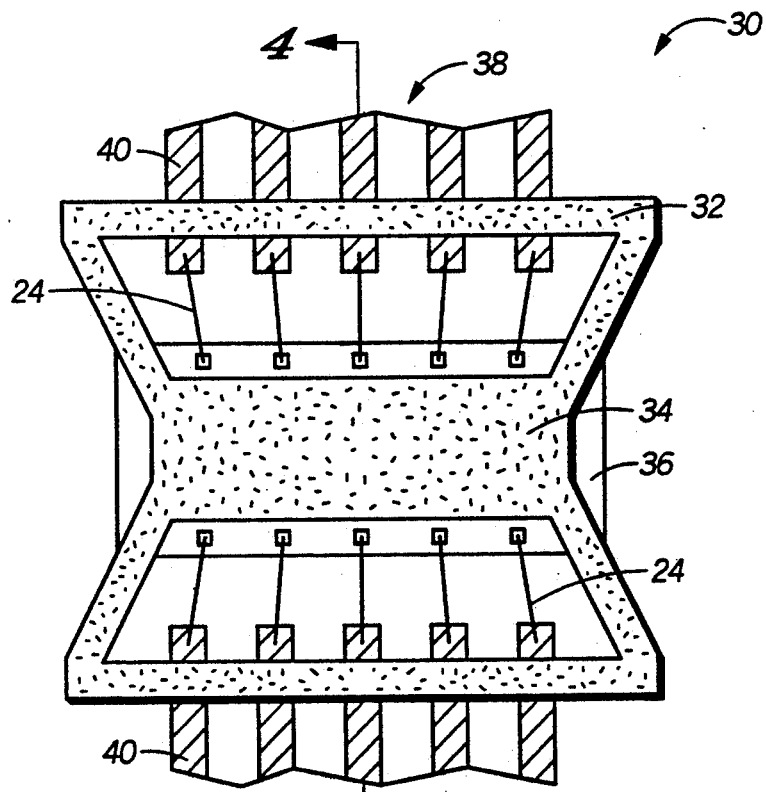
FIG. 2 illustrates, in a top view, a semiconductor die attached to a leadframe (partially illustrated) via another configuration of a support tape, in accordance with the present invention.

FIG. 2 partially illustrates a top view of a leadframe assembly 30 wherein the support tape 32 has a different configuration than the window frame configuration illustrated in FIG. 1. In this illustration, the support tape 32 has a die support surface 34 that covers a substantial portion of an active surface of a semiconductor die 36. If a portion of the circuitry on the active surface of the die 36 is sensitive to alpha ray emission, it could be designed so that that portion is in the center region of the die which would then be protected by the die support surface 34. In this case, the die support surface 34 would not only serve to support the semiconductor die 36 but also to protect the die 36 from alpha ray emission. Again, the support tape 32 must be electrically nonconductive and can be the same type of material as that discussed previously for FIG. 1. As illustrated in FIG. 2, a leadframe 38 (partially illustrated) has a plurality of leads 40 extending to only two sides of the semiconductor die 36, which is typical of a thin small outline package (TSOP) configuration. Many memory semiconductor devices require only leads on two sides of device whereas microprocessors tend to require leads on all four sides due to the layout of the bonding pads on these different devices. The semiconductor die 36 is electrically connected to the plurality of leads 40 by a plurality of wire bonds 24. The advantages of using wire bonds are the same as those aforementioned.

Figure 3:
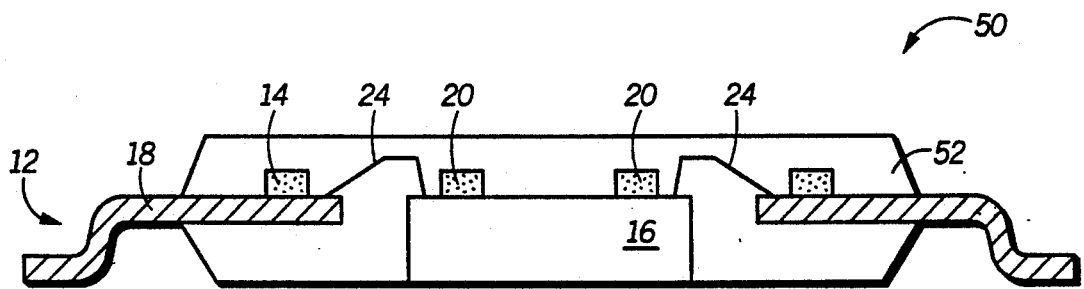
FIG. 3 illustrates, in a cross-sectional view along line 3—3, a semiconductor device in an embodiment of the present invention.

FIG. 3 illustrates, in cross section, an embodiment of the present invention showing a semiconductor device 50 utilizing the leadframe assembly 10 of FIG. 1, wherein the cross section of the leadframe assembly 10 is taken along line 3—3 of FIG. 1. FIG. 3 illustrates the semiconductor die 16 mounted to a leadframe 12 by the electrically nonconductive support tape 14. As illustrated in this cross section, the window frame configuration of the die support surface 20 of the support tape 14 leaves the center region of the active surface of the semiconductor die 16 uncovered. As stated previously, however, other configuration may also be used for the die support surface 20. Also illustrated in this view is the fact that the active surface of the semiconductor die 16 is substantially coplanar with the top surface of the plurality of leads 18 of the leadframe 12. This relative position between the two surfaces allows for a thin upper half of a package body 52.

The semiconductor die 16 is electrically connected to the plurality of leads 18 of the leadframe 12 by a plurality of low loop height wire bonds 24. Because a low profile or thin semiconductor device is desired, lower loop heights on the wire bonds 24 are preferable. With current conventional low loop height wire bonding, a loop height of 0.170 millimeter is possible. A portion of the support tape 14 is attached across the leads 18. A resin package body 52 is formed to protect the wire bonds 24, the active surface of the semiconductor die 16, and a portion of the plurality of leads 18. The resin package body 52 leaves the inactive surface of the semiconductor die 16 exposed for enhanced thermal dissipation, wherein the bottom surface of the resin package body 52 is substantially coplanar with the inactive surface of the semiconductor die 16.

An advantage to having the bottom surface of the package body 52 substantially coplanar with the inactive surface of the die 16 is that a thinnest lower half of a package body 52 is formed. The thickness of the resin package body 52 limited to the thickness of the semiconductor die 16 and to the loop heights of the wire bonds 24. Hence, by having low loop height wire bonds and a package body that exposes the inactive surface of the die, a very thin package body 52 for the device 50 becomes possible. As the semiconductor die thickness decreases, the package body can be made thinner. However, the semiconductor die 16 must remain slightly thicker than the plurality of leads 18 because the resin package body 52 must totally encapsulate that portion of the leads 18 that are internal to the package body 52. Typical leadframe stock is 0.127 millimeter to 0.150 millimeter which is substantially thinner than typical semiconductor die thickness which is approximately 0.30 millimeter. Therefore, it is not envisioned that maintaining a die thickness greater than a leadframe thickness will be of concern. With current conventional assembly technology, the thickness of the resin package body can be approximately 0.5 millimeter. However, if the semiconductor die thickness and the loop height of the wire bonds are reduced, then a thinner package body is possible.

The external configuration of the leads 18 can be formed to any desired shape although a gull-wing leaded configuration is illustrated. Furthermore, the leads can exit the package body on all four sides, similar to a TQFP configuration, or only on two sides, similar to a TSOP configuration. The resin package body 52 can be molded using conventional transfer molding equipment, although injection molding may also be possible. Conventional resin encapsulant such as epoxy resin or novolac resin may be used for the package body. A major advantage to the method proposed for manufacturing the semiconductor device with a thin package body is that conventional equipment and processes can be used.

Figure 4:
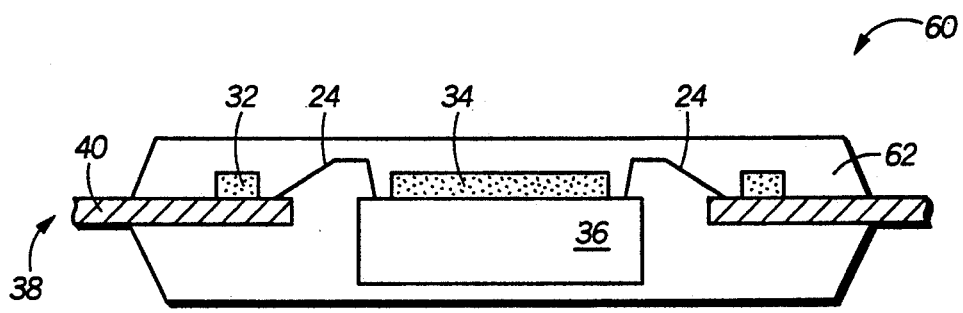
FIG. 4 illustrates, in a cross-sectional view along line 4—4, a semiconductor device in another embodiment of the present invention.

FIG. 4 illustrates, in cross-section, another embodiment of the present invention showing a semiconductor device 60 utilizing the leadframe assembly 30 of FIG. 2, wherein the cross section of the leadframe assembly 30 is taken along line 4—4 of FIG. 2. In this embodiment, the die support surface 34 of the support tape 32 covers a large central region of the semiconductor die 36. This configuration of a die support surface may be desirable if the semiconductor die requires alpha ray emission protection. In that case, it would certainly be desirable to design the semiconductor die so that all alpha ray emission sensitive circuitry be located in the central region of the die where it would be covered and protected by the die support surface of the support tape.

In this embodiment, as illustrated in FIG. 4, the resin package body 62 totally encapsulates the semiconductor die 36. Although a total encapsulation will give rise to a thicker package body, it may desirable in some applications. The total encapsulation would better protect the semiconductor die from moisture ingress, which can cause corrosion of the semiconductor die, than leaving the inactive surface of the die exposed as the first embodiment illustrated in FIG. 3. However, some devices require good thermal dissipation over moisture protection, so each of the discussed embodiments fulfills different device requirements.

Figure 5:
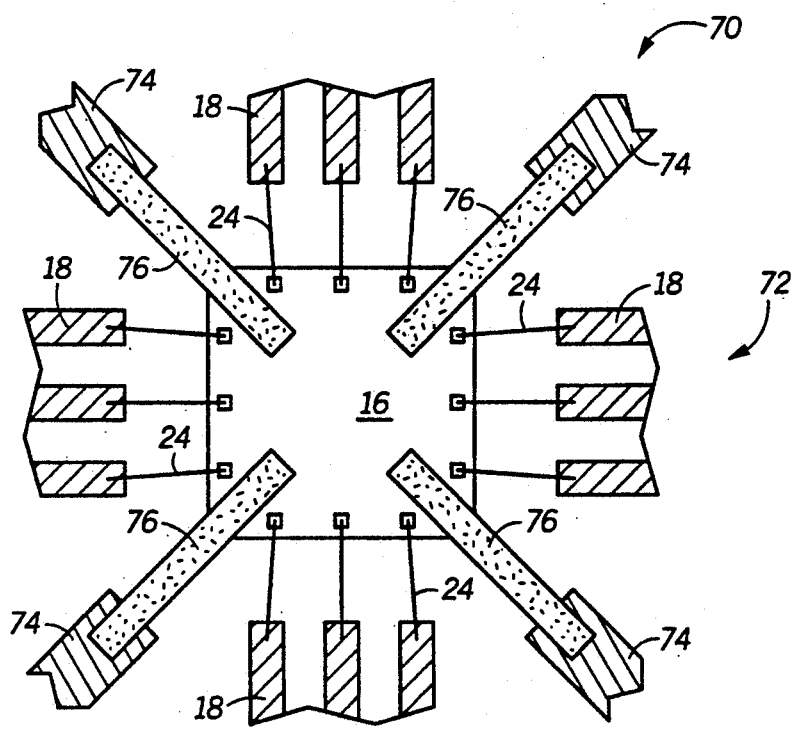
FIG. 5 illustrates, in a top view, a semiconductor die attached to a leadframe (partially illustrated) via another configuration of a support tape, in accordance with the present invention.
Figure 6:
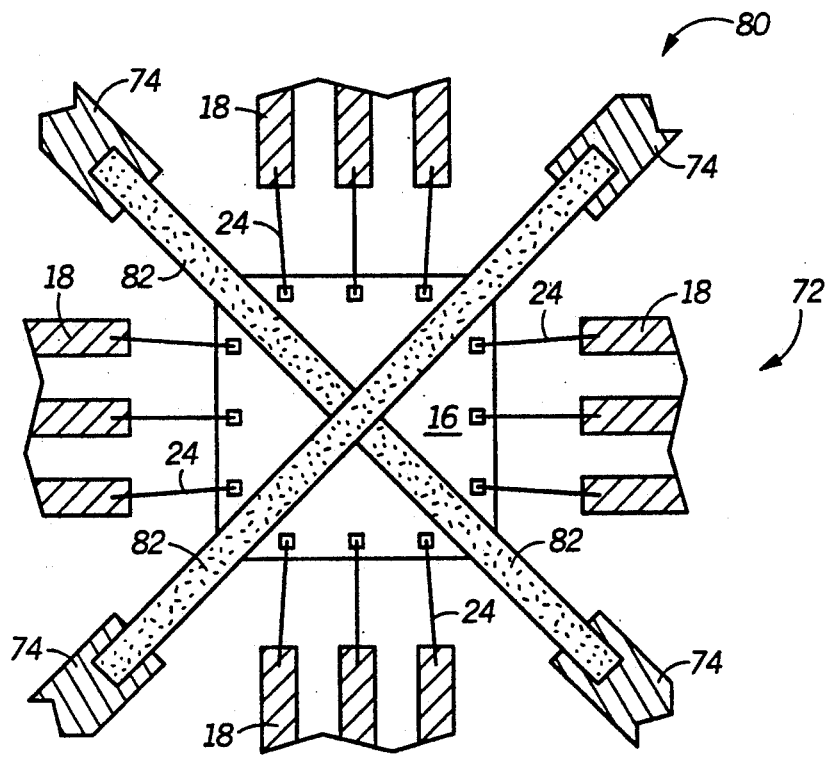
FIG. 6 illustrates, in a top view, a semiconductor die attached to a leadframe (partially illustrated) via yet another configuration of a support tape, in accordance with the present invention.
Figure 7:
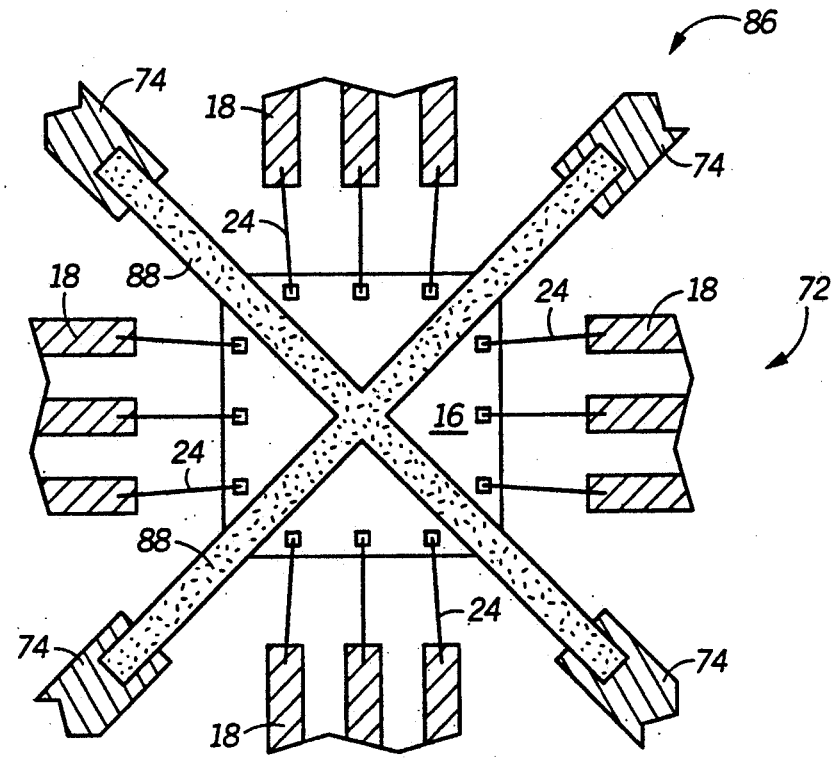
FIG. 7 illustrates, in a top view, a semiconductor die attached to a leadframe (partially illustrated) via yet an alternate configuration of a support tape, in accordance with the present invention.

FIGS. 5-7 illustrate other possible configurations for the support tape. In FIG. 5, a top view of a leadframe assembly 70 is partially illustrated. Leadframe assembly 70 has a leadframe 72 (partially illustrated) that has a plurality of tie bars 74 angled diagonally toward semiconductor die 16. In this configuration, the support tape is composed of a plurality of individual unconnected support tape strips 76 which are attached at one end to the tie bars 74. The semiconductor die 16 is mounted to the support tape 76 at remaining end of the strips. In other words, the die support surface of the support tape in this configuration is composed from the ends of the individual strips of the support tape. The location of the individual support tape strips 76 on the active surface of the die should not interfere with the wire bonds 24 that electrically connect the semiconductor die 16 to the leadframe 72. Again, a polymer tape, such as one having a polyimide layer and an adhesive layer, can be used for the support tape which is the same as that discussed previously for the other embodiments.

In FIG. 6, another configuration of support tape is illustrated in a top view of a leadframe assembly 80, wherein the leadframe 72 is only partially drawn. In this configuration, the support tape is composed of two separate support tape strips 82 that are attached at each end to opposing tie bars 74 of the leadframe 72. The support tape strips 82 intersect each other in a central region of the semiconductor die 16. The area where the support tape strips 82 make contact with the active surface of the semiconductor die 16, otherwise referred to as the die support surface, should not interfere with the wire bonds 24 that electrically connect the die 16 to the leadframe 72. It should be noted again that the support tape strips 82 are made from an electrically non-conductive material such as a polymer tape.

FIG. 7 illustrates, in a top view, yet another configuration of the support tape for leadframe assembly 86 (partially illustrated). The support tape 88, in this configuration, is in the form of an "X" which is one piece of tape instead of the two individual strips as shown previously. The ends of the support tape 88 are attached to the tie bars 74 of the leadframe 72 as before. The central "X" region of the support tape 88 provides a die support surface for the semiconductor die 16.

One application where these alternative configurations of support tape may be used is in the case of an existing leadframe having a mounting flag (not illustrated). A user can simply punch out or otherwise mechanically remove the mounting flag and then apply the support tape strips to the tie bars of the leadframe at the time of assembly. However, the support tape may also be attached at the leadframe manufacturer before being shipped to the user.

The foregoing description and illustrations contained herein demonstrate many of the advantages associated with the present invention. In particular, it has been revealed that a low cost semiconductor device having a thin package body can be manufactured. Moreover, the manufacturing of such a device utilizes conventional plastic assembly technology which is substantially lower in cost than TAB. Yet another advantage is that the present invention uses simple well characterized processes to produce a device that is paper thin in addition to having enhanced thermal dissipation by exposing the inactive surface of the die. Furthermore, standard stamped leadframes can be used which is a substantial cost savings over etched TAB tape. The support tape can be applied by the leadframe manufacturer or during assembly. Additionally, if a conventional leadframe is used to practice the invention, the leadframe flag can simply be punched out or otherwise mechanically removed, and then the support tape can be applied. The support tape can be attached to the existing tie bars on the leadframe. If the leadframe is not fine pitched, it may not be necessary to attach the support tape transverse to the leads because the leads do not need stabilization. This invention allows for flexibility in manufacturing yet retains its low cost advantage because of the use of conventional equipment and processes.

Thus it is apparent that there has been provided, in accordance with the invention, a semiconductor device having a thin package body that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, other configurations of the support tape and the die support surface may be used. For example, a leadframe having tie bars may only require a partial die support surface in the form of support tape tie bars instead of a full surface or a window frame surface. In addition, the invention is not limited to any specific configuration of a semiconductor device. The device may take the form of a TQFP or TSOP or any other configuration. It is also important to note that the present invention is not limited in any way to any specific type of semiconductor devices. Memory devices and microprocessors as well as digital signal processors or application specific ICs or any other device requiring a thin package body may be housed in an embodiment of the invention. Therefore, it is intended that this invention encompass all such variations and modifications as fall within the scope of the appended claims.

What is claimed is:

1. A semiconductor device comprising:
  a leadframe having a surface and plurality of leads, each lead having a length and a surface;
  an electrically nonconductive support tape attached to a portion of the surface of the leadframe, the electrically nonconductive support tape having a die support surface;
  a semiconductor die having an active surface with a plurality of bonding pads thereon and an inactive surface, wherein the semiconductor die is attached to the die support surface of the electrically nonconductive support tape in a manner that positions the active surface of the semiconductor die substantially coplanar with the surface of the plurality of leads, the active surface of the semiconductor die being larger than the die support surface so that the plurality of bonding pads are exposed; wherein an inner portion of the plurality of leads extend toward and terminate proximally to a perimeter of the semiconductor die:
  a plurality of wire bonds electrically connecting the plurality of bonding pads on the active surface of the semiconductor die to the surface of the plurality of leads of the leadframe; and
  a resin package body protecting the plurality of wire bonds, the active surface of the semiconductor die and a portion of the length of the plurality of leads, wherein the portion of the length is completely encapsulated by the resin package body.

2. The device of claim 1 wherein the resin package body totally encapsulates the semiconductor die.

3. The device of claim 1 wherein the resin package body exposes the inactive surface of the semiconductor die so that a surface of the resin package body is substantially coplanar with the inactive surface of the semiconductor die.

4. The device of claim 1 wherein the plurality of leads exits from either two sides or four sides of the resin package body.

5. The device of claim 1 wherein the leadframe further comprises a plurality of tie bars and wherein the electrically nonconductive support tape is attached to the plurality of tie bars to provide a plurality of die support surfaces.

6. The device of claim 1 wherein the electrically nonconductive support tape comprises a polyimide layer and an adhesive layer, wherein the adhesive layer is used to attach the electrically nonconductive support tape to the leadframe and to attach the semiconductor die to the die support surface of the electrically nonconductive support tape.

7. The device of claim 1 wherein the electrically nonconductive support tape is attached transversely to the length of the plurality of leads and wherein the die support surface of the electrically nonconductive support tape has a window frame configuration.

8. The device of claim 1 wherein the plurality of wire bonds has a loop height substantially in a range of 0.170 millimeter or less.

9. The device of claim 3 wherein the resin package body has a thickness substantially in a range of 0.5 millimeter or less.

10. A semiconductor device comprising:
  a leadframe having a surface and plurality of leads, each lead having a length and a surface;
  an electrically nonconductive support tape attached to a portion of the surface of the leadframe including transversely to the length of the plurality of leads, the electrically nonconductive support tape having a die support surface in a window frame configuration;
  a semiconductor die having an active surface with a plurality of bonding pads thereon and an inactive surface, wherein the semiconductor die is attached to the die support surface of the electrically nonconductive support tape in a manner that positions the active surface of the semiconductor die substantially coplanar with the surface of the plurality of leads, the active surface of the semiconductor die being larger than the die support surface such that the plurality of bonding pads are exposed wherein an inner portion of the plurality of leads extend toward and terminate proximally to a perimeter of the semiconductor die:
  a plurality of wire bonds electrically connecting the plurality of bonding pads on the active surface of the semiconductor die to the surface of the plurality of leads of the leadframe; and
  a resin package body protecting the plurality of wire bonds, the active surface of the semiconductor die and a portion of the length of the plurality of leads, wherein the portion of the length is completely encapsulated by the resin package body.

11. The device of claim 10 wherein the resin package body exposes the inactive surface of the semiconductor die so that a surface of the resin package body is substantially coplanar with the inactive surface of the semiconductor die.

12. The device of claim 10 wherein the electrically nonconductive support tape comprises a polyimide layer and an adhesive layer, wherein the adhesive layer is used to attach the electrically nonconductive support tape to the leadframe and to attach the semiconductor die to the die support surface of the electrically nonconductive support tape.

13. The device of claim 10 wherein the plurality of wire bonds has a loop height substantially in a range of 0.170 millimeter or less.

14. The device of claim 11 wherein the resin package body has a thickness substantially in a range of 0.5 millimeter or less.

* * * * *